(12) United States Patent
Apalkov et al.

(10) Patent No.: US 8,766,383 B2
(45) Date of Patent: Jul. 1, 2014

(54) METHOD AND SYSTEM FOR PROVIDING A MAGNETIC JUNCTION USING HALF METALLIC FERROMAGNETS

(75) Inventors: Dmytro Apalkov, San Jose, CA (US); Xueti Tang, San Jose, CA (US); Mohamad Towfik Krounbi, San Jose, CA (US); Vladimir Nikitin, Campbell, CA (US); Alexey Vasilyevitch Khvalkovskiy, Milpitas, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 72 days.

(21) Appl. No.: 13/517,731

(22) Filed: Jun. 14, 2012

(65) Prior Publication Data

US 2013/0009260 A1    Jan. 10, 2013

Related U.S. Application Data

(60) Provisional application No. 61/505,469, filed on Jul. 7, 2011.

(51) Int. Cl.
*H01L 29/82* (2006.01)
*G11C 11/00* (2006.01)
*G11C 11/14* (2006.01)
*G11C 11/15* (2006.01)

(52) U.S. Cl.
USPC ........... 257/421; 257/422; 365/158; 365/171; 365/173

(58) Field of Classification Search
USPC .................. 257/421, 422; 365/158, 171, 173
See application file for complete search history.

(56) References Cited

U.S. PATENT DOCUMENTS

| | | | |
|---|---|---|---|
| 5,695,864 A | 12/1997 | Slonczewski | |
| 6,020,000 A | 2/2000 | Wong et al. | |
| 6,256,223 B1 | 7/2001 | Sun | |
| 6,532,164 B2 | 3/2003 | Redon et al. | |
| 6,611,405 B1 * | 8/2003 | Inomata et al. | 360/324.2 |
| 6,639,291 B1 | 10/2003 | Sin | |
| 6,721,149 B1 | 4/2004 | Shi | |
| 6,747,301 B1 | 6/2004 | Hiner | |
| 6,771,534 B2 | 8/2004 | Stipe | |
| 6,829,161 B2 | 12/2004 | Huai et al. | |
| 6,844,605 B2 | 1/2005 | Nishimura | |

(Continued)

FOREIGN PATENT DOCUMENTS

| | | |
|---|---|---|
| EP | 2182532 | 5/2010 |
| JP | 11-120758 | 4/1999 |

OTHER PUBLICATIONS

Extended European Search Report for 1186520.0-2210 dated Feb. 2, 2012.
Office Action issued Apr. 2008 for U.S. Appl. No. 11/239,939.

(Continued)

*Primary Examiner* — Karen Kusumakar
(74) *Attorney, Agent, or Firm* — Convergent Law Group LLP

(57) ABSTRACT

A method and system provide a magnetic junction usable in a magnetic device. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the free layer and the pinned layer include at least one half-metal.

22 Claims, 6 Drawing Sheets

(56) References Cited

U.S. PATENT DOCUMENTS

| | | | |
|---|---|---|---|
| 6,967,863 | B2 | 11/2005 | Huai |
| 6,992,359 | B2 | 1/2006 | Nguyen et al. |
| 7,057,921 | B2 | 6/2006 | Valet |
| 7,088,609 | B2 | 8/2006 | Valet |
| 7,101,600 | B1 | 9/2006 | Kim |
| 7,106,624 | B2 | 9/2006 | Huai et al. |
| 7,161,829 | B2 | 1/2007 | Huai et al. |
| 7,190,611 | B2 | 3/2007 | Nguyen et al. |
| 7,242,045 | B2 | 7/2007 | Nguyen et al. |
| 7,486,551 | B1 | 2/2009 | Li et al. |
| 7,489,541 | B2 | 2/2009 | Pakala et al. |
| 7,502,249 | B1 | 3/2009 | Ding |
| 7,532,503 | B2 * | 5/2009 | Morise et al. ............ 365/158 |
| 7,532,505 | B1 | 5/2009 | Ding |
| 7,630,234 | B2 | 12/2009 | Sugibayashi et al. |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2003/0227807 | A1 | 12/2003 | Nakamura et al. |
| 2004/0125647 | A1 | 7/2004 | Tsuchida et al. |
| 2005/0040433 | A1 | 2/2005 | Nozieres et al. |
| 2005/0042367 | A1 | 2/2005 | Nemoto et al. |
| 2005/0104101 | A1 | 5/2005 | Sun et al. |
| 2005/0174702 | A1 | 8/2005 | Gill |
| 2007/0091670 | A1 | 4/2007 | Hidaka et al. |
| 2008/0007992 | A1 | 1/2008 | Wang et al. |

OTHER PUBLICATIONS

Office Action issued Sep. 2008 for U.S. Appl. No. 11/239,939.
Office Action issued Jan. 2010 for U.S. Appl. No. 12/133,671.
Office Action issued Apr. 2009 for U.S. Appl. No. 12/133,671.
Office Action issued Mar. 2011 for U.S. Appl. No. 12/638,902.
PCT International Search Report and Written Opinion of the ISA, application No. PCT/US08/64794.
PCT International Search Report and Written Opinion of the ISA, application No. PCT/US08/66369.
PCT International Search Report and Written Opinion of the ISA, application No. PCT/US10/47941.
PCT International Search Report and Written Opinion of the ISA, application No. PCT/US10/59184.
F.J. Albert, et al., "Spin-Polarized Current Switching of a Co Thin Film Nanomagnet," Applied Physics Letters, vol. 77, No. 23, pp. 3809-3811, Dec. 4, 2000.
L. Berger et al., "Emission of Spin Waves by a Magnetic Multilayer Traversed by a Current," Physical Review B, vol. 54, No. 13, pp. 9353-9358, Oct. 1, 1996.
J.Daughton, "Magnetoresistive Random Access Memory (MRAM)," Copyright Feb. 4, 2000.
Fromter, et al., "Imaging the Cone State of the Spin Reorientation Transition," Physical Review Letters, 100:207202-1-4 (2008).
J.Groller et al., "Spin-Polarized Current Induced Switching in Co/Cu/Co Pillars," Applied Physics Letters, vol. 78, No. 25, pp. 3663, Jun. 4, 2001.
J.A. Katine et al., "Current-Driven Magnetization Reversal and Spin-Wave Excitations in Co/Cu/Co Pillars," The American Physical Society, vol. 84, No. 14, Apr 3, 2000, pp. 3149-3151.
A.D. Kent, et al., "Spin-Transfer-Induced Precessional Magnetization Reversal," Applied Physics Letters, vol. 84, No. 19, May 10, 2004, pp. 3897-3899.
D.J. Mapps et al., "A Non-Volatile Solid-State Memory Using the Magnetic Spin-Dependent-Tunneling Effect," Datatech, pp. 25-28.
E.G. Myers et al., "Point-Contact Studies of Current-Controlled Domain Switching in Magnetic Multilayers," Journal of Applied Physics, vol. 87, No. 9, May 1, 2000, pp. 5502-5503.
Nishimura, et al., "Magnetic Tunnel Junction Device with Perpendicular Magnetization Films for High-Density Magnetic Random Access Memory," Journal of Applied Physics, 90(8):5246-49, (2000).
J.C. Slonczewski, "Current-Driven Excitation of Magnetic Multilayers," Journal of Magnetism and Magnetic Materials, 159 (1996), 1.1-1.7.
J.C. Slonczewski, "Conductance and Exchange Coupling of Two Ferromagnets Separated by a Tunneling Barrier," The American Physical Society, vol. 39, No. 10, Apr. 1, 1999, pp. 6995-7002.
J.C. Slonczewski, "Theory and Application of Exchange-Driven Switching," IEEE, Apr. 2000, pp. CE-02.
S. Soeya et al., Development of Half-Metallic Ultrathin Fe3/4 Films for Spin-Transport Devices, Applied Physics Letters, vol. 80, No. 5, pp. 823-825, Feb. 4, 2002.
Stillrich, et al., "Magnetic Anisotropy and the Cone State in Co/Pt Multilayer Films," Journal of Applied Physics, 105:07C308 (2009).
J.Z. Sun, "Current-Driven Magnetic Switching in Magnanite Trilayer Junctions," Journal of Magnetism and Magnetic Materials, No. 202, 1999, pp. 157-162.
Varga, et al., "Experimental Demonstration of Non-Majority, Nanomagnet Logic Gates," (2009).
Varga, et al., Programmable Nanomagnetic-Logic Majority Gate (2010).

* cited by examiner

METHOD AND SYSTEM FOR PROVIDING A MAGNETIC JUNCTION USING HALF METALLIC FERROMAGNETS

CROSS-REFERENCE TO RELATED APPLICATIONS

This Application claims the benefit of U.S. Provisional Patent Application Ser. No. 61/505,469, filed Jul. 7, 2011 and is assigned to the assignee of the present application and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically or ferromagnetically coupled through thin conductive layers, such as Ru. In such a SAF, multiple magnetic layers interleaved with a thin layer of Ru may be used. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Although the conventional MTJ 10 may be written using spin transfer and used in an STT-RAM, there are drawbacks. For example, current required to switch the magnetic moment of the conventional free layer 20 may be high. High currents are undesirable for a number of reasons. A higher current consumes more power, has a higher probability of resulting in damage to the conventional tunneling barrier 18, and may have a higher rise time that results in lower programming rates. Thus, performance of a memory using the conventional MTJ is still desired to be improved.

BRIEF SUMMARY OF THE INVENTION

The exemplary embodiments provide a magnetic junction usable in a magnetic device. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the free layer and the pinned layer include at least one half-metal

DETAILED DESCRIPTION OF THE INVENTION

Figure 1:
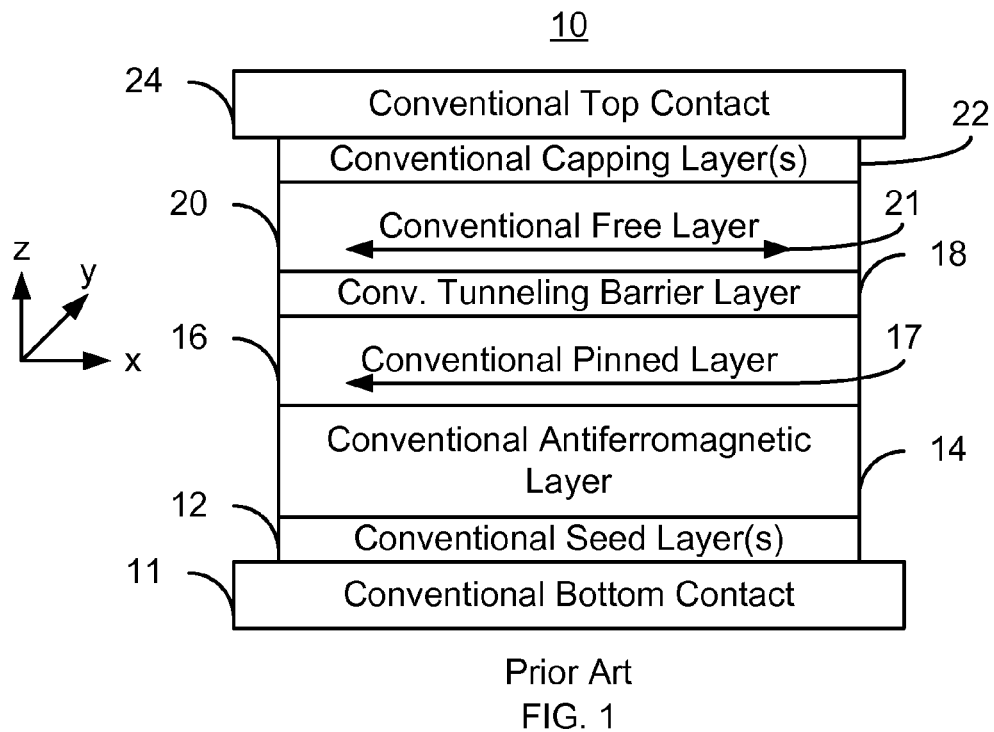
FIG. 1 depicts conventional magnetic tunneling junction switched using spin transfer torque.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments may also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular-to-plane" or "out-of-plane" corresponds to a direction that is substantially perpendicular to one or more of the layers of the magnetic junction.

Figure 2:
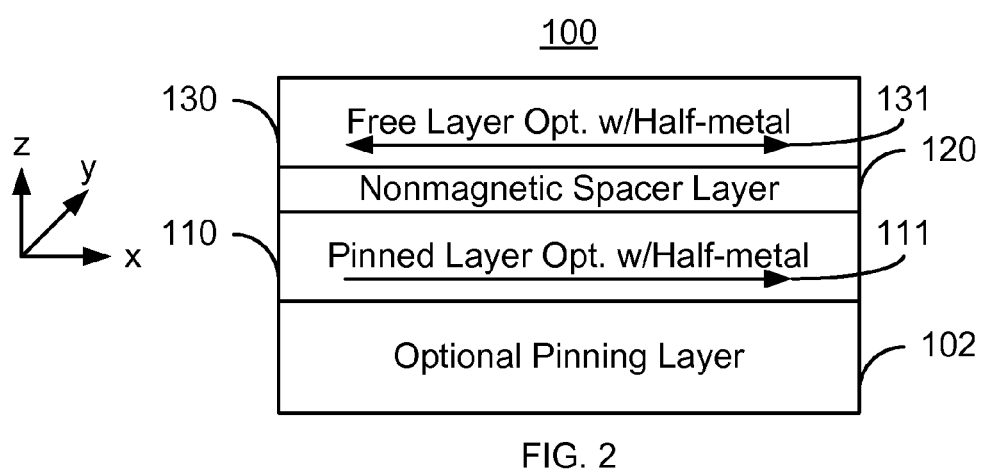
FIG. 2 depicts an exemplary embodiment of a magnetic junction.

FIG. 2 depicts an exemplary embodiment of a magnetic junction 100 usable in a magnetic memory or other device. For example, the magnetic junction 100 may be a magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-RAM. For clarity, FIG. 2 is not to scale. The magnetic junction 100 includes a pinned layer 110, a nonmagnetic spacer layer 120, and a free layer 130. Also shown is optional pinning layer 102, which may be an antiferromagnetic (AFM) layer, such as PtMn. Although layers 102, 110, 120, and 130 are shown with a particular orientation, this orientation may vary in other embodiments. For example, the pinned layer 110 may be at the top (furthest from a substrate that is not shown) of the magnetic junction 100. For simplicity, other layers, such as seed and/or capping layers that might be present are not shown.

The nonmagnetic spacer layer 120 may be a tunneling barrier layer. In some embodiments, the spacer layer 120 is MgO. In some such embodiments, the nonmagnetic spacer layer 120 is crystalline MgO, which may enhance the tunneling magnetoresistance (TMR) of the magnetic junction 100. In other embodiments, the spacer layer may be a conductor, such as Cu. In alternate embodiments, the nonmagnetic spacer layer 120 might have another structure, for example a granular layer including conductive channels in an insulating matrix.

In the embodiment shown, the magnetizations 111 and 131 of the layers 110 and 130 are in-plane. However, other orientations are possible. Further, as the magnetization of the free layer 130 is changeable, the magnetization is represented by easy axis 131. The magnetic junction 100 is configured such that the free layer magnetization 131 is switchable using a current driven through the magnetic junction. Thus, the magnetic junction 100 utilizes spin transfer torque for switching. In some embodiments, other phenomena may be used in addition to or in lieu of spin transfer torque to switch the magnetic junction.

In some embodiments, the pinned layer 110 and free layer 130 may include ferromagnetic materials. Thus, layers 110 and 130 may include one or more of Ni, Fe, and Co, particularly in an alloy form. In some embodiments, the layers 110 and 130 include CoFe. The layers 110 and 130 are configured to be stable at room temperature. For example, the magnetic anisotropy energy for the layers 110 and 130 may be at least sixty times $k_b T$. Although the layers 110 and 130 are depicted as simple layers, in other embodiments, one or more of the layers 110 and 130 may be a multilayer. For example, the pinned layer 110 and/or the free layer 130 may be a SAF including magnetic layers antiferromagnetically or ferromagnetically coupled through thin layers, such as Ru. In such a SAF, multiple magnetic layers interleaved with thin layer(s) of Ru or other material may be used. The layer 110, and/or 130 may also be another multilayer.

The pinned layer 110 and/or free layer 130 include half-metals. In some embodiments, the pinned layer 110 and/or the free layer 130 consists of a half-metals. In other embodiments, the multilayer in the pinned layer 110 and/or the free layer 130 includes half-metal layers. For example, the pinned layer 110 and/or the free layer 130 may have a layer at the interface with the spacer layer 120 that includes a half-metal. In other embodiments, the pinned layer 110 and/or the free layer 130 may be an alloy including one or more half-metals. A half-metal can have a very high spin polarization. Spin polarization (P) can be defined as the percentage of up (down) spins minus the percentage of down (up) spins in a ferromagnetic material at the Fermi level. Most common magnetic materials, such as Fe, Co, Ni and their alloys have a low P of less than 50%. Half-metals are ferromagnets having a very high P (approaching 100%) that are metallic in one spin orientation and insulating in the other spin orientation. Some half-metallic materials that have been discovered include $CrO_2$, $Sr_2FeMoO_6$, $(La0.7Sr0.3)MnO_3$, $Fe_3O_4$, and NiMnSb. Other half-metallic materials that might be used include all compounds of the type T=XYZ, where X is Mn, Fe, Co, Ni, Cu, Zn, Ru, Rh, Pd, Ag, Cd, Ir, Pt, or Au; Y is Ti, V, Cr, Mn, Fe, Y, Zr, Nb, Hf, Ta, Gd, Tb, Dy, Ho, Er, Tm, Yb, or Lu; and Z is Al, Si, Ga, Ge, As, In, Sn, Sb, Pb, Bi. Half-metallic materials might also include any or all compounds T listed above with addition of material M to make TM compound, where M is Mn, Fe, Co, Ni, Cu, Zn, Ru, Rh, Pd, Ag, Cd, Ir, Pt, Au, Ti, V, Cr, Mn, Fe, Y, Zr, Nb, Hf, Ta, Gd, Tb, Dy, Ho, Er, Tm, Yb, Lu, Al, Si, Ga, Ge, As, In, Sn, Sb, Pb, or Bi. Further, half-metallic oxides such as manganese oxides include $RE_{1-x}M_xMnO_3$, where x is less than or equal to 1, M is Ca, Sr, Ba, or Pb, RE is a rare earth metal such as La, Ce, Pr, Nd, Pm, Sm, Eu, Gd, Tb, Dy, Ho, Er, Tm, Yb, or Lu or an alkaline-earth metal such as Be, Mg, Ca, Sr, Ba, or Ra. Other half-metallic oxides that might be used include double perovskites $A_2MM'O_6$ where A is a rare earth or alkaline-earth metal described above (e.g. La, Ce, Pr, Nd, Pm, Sm, Eu, Gd, Tb, Dy, Ho, Er, Tm, Yb, Lu, Be, Mg, Ca, Sr, Ba, or Ra) and M and M' are two different elements selected from the following: Sc, Ti, V, Mn, Fe, Co, Ni, Cu, Zn, Y, Zr, Nb, Mo, Tc, Ru, Rh, Pd, Ag, Hf, Ta, W, Re, Pt, Au, and Hg. The half metals might also include $CrO_2$ and $Fe_3O_4$.

In operation, a write current is driven through the magnetic junction 100. Depending upon the direction of the write current, the free layer 130 may be switched so that its magnetization 131 is parallel or anti-parallel to the magnetization 111. In some embodiments, a magnetic field, such as an external magnetic field is applied in the direction to which the free layer is desired to be switched, in order to improve the switching characteristics of the free layer 130. Thus, the free layer 130 is switchable using spin transfer. To read the data stored by the magnetic junction 100, a read current may be driven through the magnetic junction 100. Based on the relative orientations of the magnetizations 111 and 131 of the pinned layer 110 and the free layer 130, respectively, a magnetoresistance is provided.

The magnetic junction 100 may have improved performance. When high spin-polarization half-metallic materials are used as magnetic layers in a magnetic junction, the opposing angular momentum negation from the small (theoretically zero for a perfect half-metal) number of minority spins may also be small. The reduction in opposing angular momentum results in a smaller switching current. The switching current is the current required to switch the magnetization of the free layer 130 using spin transfer. The decrease in the switching current may be significant. In some embodiments, the switching current may theoretically decrease by more than a factor of 5 when going from materials of spin polarization of 35% to materials of spin polarization of 80% assuming coherent electron scattering in the free magnetic layer.

Figure 3:
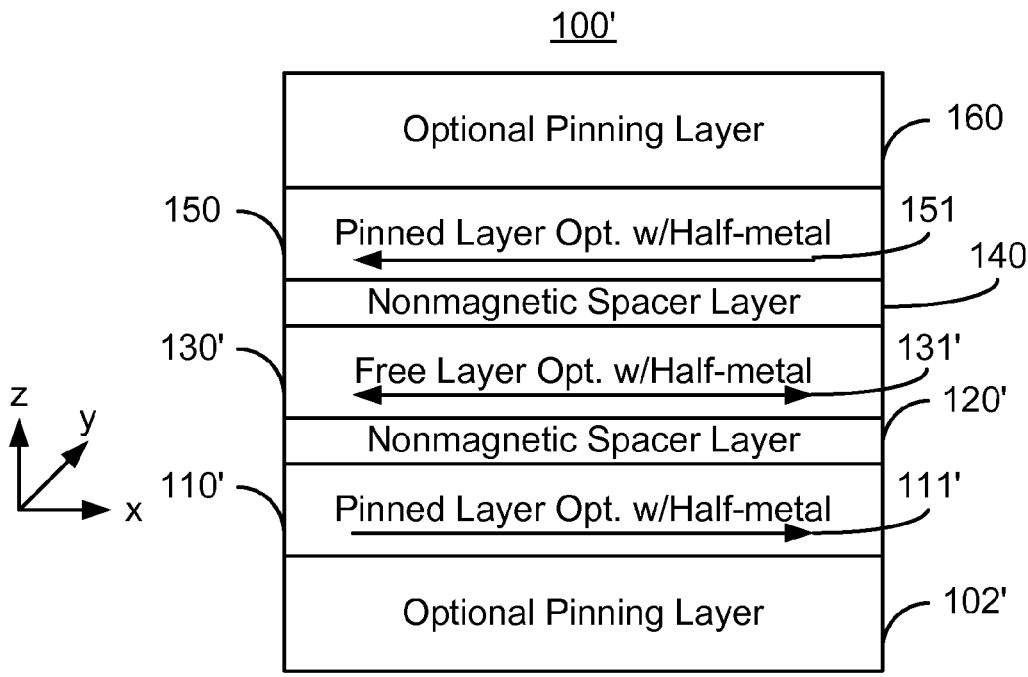
FIG. 3 depicts another exemplary embodiment of a magnetic junction.

FIG. 3 depicts an exemplary embodiment of a magnetic junction 100'. For clarity, FIG. 3 is not to scale. The magnetic junction 100' is analogous to the magnetic junction 100. Consequently, analogous components are labeled similarly. The magnetic substructure 100' thus includes a first pinned layer 110', a first nonmagnetic spacer layer 120', and a free layer 130' that are analogous to the first pinned layer 110, the first nonmagnetic spacer layer 120, and the free layer 130. The magnetic junction 100' also includes a second nonmagnetic spacer layer 140, and a second pinned layer 150. A second optional pinning layer 160 may also be provided.

The structure and function of the layers 110', 120', and 130' are analogous to the structure and function of the layers 110, 120, and 130, respectively. In addition, an additional nonmagnetic spacer layer 140 and additional pinned layer 150, with optional pinning layer 160 are shown. The additional nonmagnetic spacer layer 140 is analogous to the spacer layer 120'. The nonmagnetic spacer layer 140 may be a tunneling barrier layer, such as MgO. In some such embodiments, the nonmagnetic spacer layer 140 is crystalline MgO. In other embodiments, the nonmagnetic spacer layer 140 may be a conductor, such as Cu. In alternate embodiments, the nonmagnetic spacer layer 140 might have another structure, for example a granular layer including conductive channels in an insulating matrix.

The additional pinned layer 150 is analogous to the pinned layer 110'. The structure and function of the pinned layer 150 may be analogous to that of the pinned layer 110'. The magnetization 151 of the pinned layer 150 is thus fixed. Further, and the pinned layer 150 may include half-metal(s). Thus, one or more of the pinned layer 110', the free layer 130', and the pinned layer 150 includes half-metals. The layer(s) 110', 130', and/or 150 may consist of half-metal(s), may include one or more layer(s) including half-metal(s), or may have another structure in which half-metal(s) are included.

Figure 4:
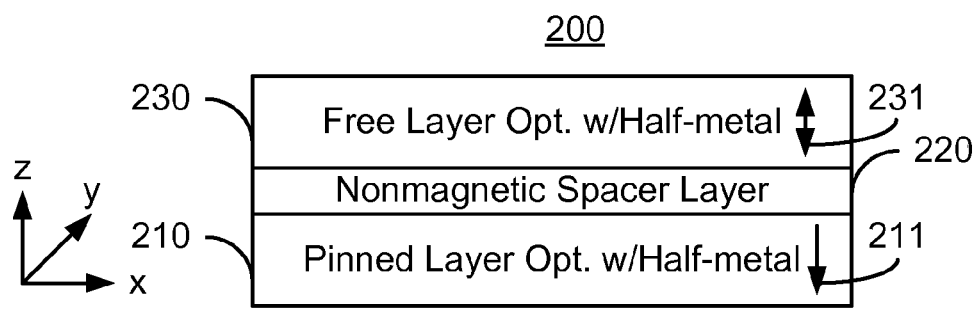
FIG. 4 depicts another exemplary embodiment of a magnetic junction.

The magnetic junction 100' operates in an analogous manner to the magnetic junction 100. The magnetic junction 100' enjoys benefits analogous to the magnetic junction 100. For example, use of half-metal(s) in one or more of the layers 110', 130', and 150 may result in a lower switching current. Thus, performance of the magnetic junction 100' may improve. Further, the magnetic junction 100' is a dual junction. As a result, the spin transfer torque of the magnetic junction 100 may be greater than that of the magnetic junction 100. Performance of the magnetic junction 100' may thus be enhanced, FIG. 4 depicts an exemplary embodiment of a magnetic junction 200. For clarity, FIG. 4 is not to scale. The magnetic junction 200 is analogous to the magnetic junction 100. Consequently, analogous components are labeled similarly. The magnetic substructure 200 thus includes a first pinned layer 210, a first nonmagnetic spacer layer 220, and a free layer 230 that are analogous to the first pinned layer 110, the first nonmagnetic spacer layer 120, and the free layer 130, respectively.

The structure and function of the layers 210, 220, and 230 are analogous to the structure and function of the layers 110, 120, and 130, respectively. The nonmagnetic spacer layer 220 may thus be a tunneling barrier layer, a conductive layer, or have another structure, such as a granular layer including conductive channels in an insulating matrix.

The pinned layer 210 and free layer 230 are analogous to the layers 110 and 130, respectively. Thus, one or more of the layers 210 and 230 include half-metal(s). The layers 210 and/or 230 may consist of half-metal(s), may include one or more layer(s) including half-metal(s), or may have another structure in which half-metal(s) are included. However, the magnetizations of the layers 210 and 230 are perpendicular to plane.

The magnetic junction 200 operates in an analogous manner to the magnetic junction 100. The magnetic junction 200 enjoys benefits analogous to the magnetic junction 100. For example, use of half-metal(s) in one or more of the layers 210 and 230 may result in a lower switching current. Thus, performance of the magnetic junction 200 may improve. Further, the magnetizations 211 and 231 are oriented out-of-plane. As a result, switching of the magnetic junction 200 may be accomplished at a lower current. Thus, performance of the magnetic junction 200 may be further enhanced.

Figure 5:
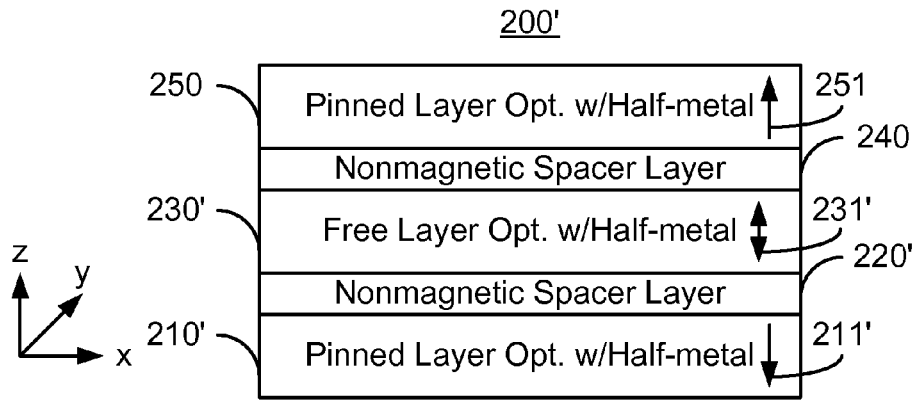
FIG. 5 depicts another exemplary embodiment of a magnetic junction.

FIG. 5 depicts an exemplary embodiment of a magnetic junction 200'. For clarity, FIG. 5 is not to scale. The magnetic junction 200' is analogous to the magnetic junction 200. Consequently, analogous components are labeled similarly. The magnetic substructure 200' thus includes a first pinned layer 210', a first nonmagnetic spacer layer 220', and a free layer 230' that are analogous to the first pinned layer 210, the first nonmagnetic spacer layer 220, and the free layer 230. The magnetic junction 200' also includes a second nonmagnetic spacer layer 240, and a second pinned layer 250.

The structure and function of the layers 210', 220', and 230' are analogous to the structure and function of the layers 210, 220, and 230, respectively. In addition, an additional nonmagnetic spacer layer 240 and additional pinned layer 250 are shown. The additional nonmagnetic spacer layer 240 is analogous to the spacer layer 220'. The nonmagnetic spacer layer 240 may be a tunneling barrier layer, such as MgO (crystalline or otherwise), a conductor, such as Cu, or may have another structure, for example a granular layer including conductive channels in an insulating matrix.

The additional pinned layer 250 is analogous to the pinned layer 210'. The structure and function of the pinned layer 250 may be analogous to that of the pinned layer 210'. The magnetization 251 of the pinned layer 250 is thus fixed. Further, and the pinned layer 250 may include half-metal(s). Thus, one or more of the pinned layer 210', the free layer 230', and the pinned layer 250 includes half-metals. The layer(s) 210', 230', and/or 250 may consist of half-metal(s), may include one or more layer(s) including half-metal(s), or may have another structure in which half-metal(s) are included.

The magnetic junction 200' operates in an analogous manner to the magnetic junction 200. The magnetic junction 200' enjoys benefits analogous to the magnetic junction 200. For example, use of half-metal(s) in one or more of the layers 210', 230', and 250 may result in a lower switching current that the perpendicular-to-plane orientation alone. Thus, performance of the magnetic junction 200' may improve. Further, the magnetic junction 200' is a dual junction. As a result, the spin transfer torque of the magnetic junction 200' may be greater than that of the magnetic junction 100. Performance of the magnetic junction 200' may thus be enhanced.

Figure 6:
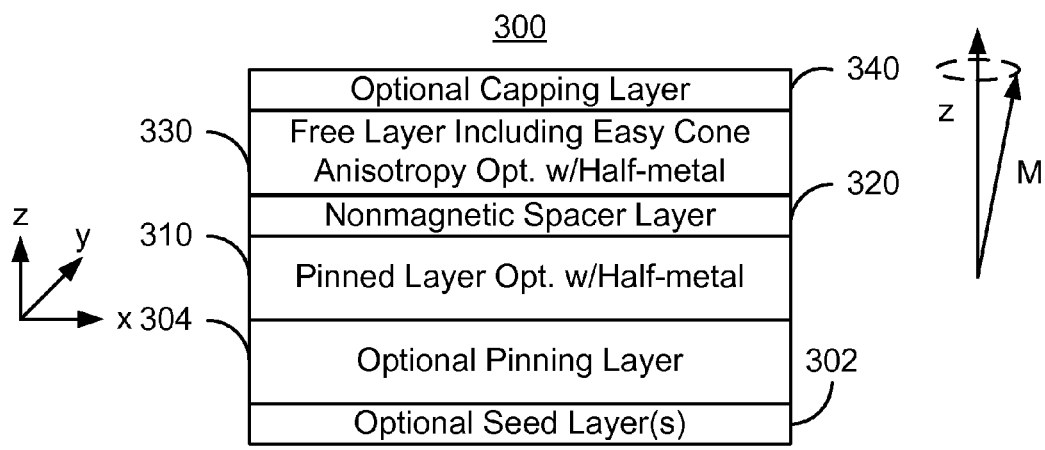
FIG. 6 depicts another exemplary embodiment of a magnetic junction.

FIG. 6 depicts an exemplary embodiment of a magnetic junction 300 use in a magnetic device, for example a magnetic memory such as an STT-RAM. For clarity, FIG. 6 is not to scale. The magnetic junction 300 includes a pinned layer 310, a nonmagnetic spacer layer 320, and a free layer 330. Also shown is optional pinning layer 304, which may be used to fix the magnetization (not shown) of the pinned layer 310. In some embodiments, the optional pinning layer 304 may be an AFM layer or multilayer that pins the magnetization (not shown) of the pinned layer 310 by an exchange-bias interaction. However, in other embodiments, the optional pinning layer 304 may be omitted or another structure may be used. Further, the magnetic junction 300 may include other and/or additional layers such as optional seed layer(s) 302 and/or optional capping layer(s) 340. The magnetic junction 300 is also configured to allow the free layer 330 to be switched between stable magnetic states when a write current is passed through the magnetic junction 300. Thus, the free layer 330 is switchable utilizing spin transfer torque.

The pinned layer 310 is magnetic and thus may include one or more of Ni, Fe, and Co, particularly in an alloy form. Although depicted as a simple layer, the pinned layer 310 may include multiple layers. For example, the pinned layer 310 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 310 may also be another multilayer. Although a magnetization is not depicted in FIG. 6, the free layer may have a perpendicular anisotropy energy that exceeds the out-of-plane demagnetization energy. In the embodiment shown, the axis of symmetry of the easy cone is substantially normal to the plane of the free layer. In another embodiment, the perpendicular anisotropy in the free layer may be less than the out-of-plane demagnetization energy. In such a case, the axis of symmetry of the easy cone is substantially in the plane of the free layer The spacer layer 320 is nonmagnetic. In some embodiments, the spacer layer 320 is an insulator, for example a tunneling barrier. In such embodiments, the spacer layer 320 may include crystalline MgO, which may enhance the tunneling magnetoresistance of the magnetic junction. In other embodiments, the spacer layer may be a conductor, such as Cu. In alternate embodiments, the spacer layer 320 might have another structure, for example a granular layer including conductive channels in an insulating matrix.

The free layer 330 is magnetic and thus may include at least one of Fe, Ni, and/or Co. The free layer 330 has a changeable magnetization (not shown) that may be switched via spin transfer. The free layer 330 is depicted as a single layer. In other embodiments, described below, the free layer 330 may include other layer(s).

The free layer 330 has an easy cone magnetic anisotropy. Easy cone anisotropy is shown by the magnetization M, in FIG. 6. Because of the easy cone anisotropy, the total magnetization of the free layer 330 has stable states of the same energy at an angle from the direction perpendicular to the plane of the layers of the magnetic junction 100 (i.e. the z-axis in FIG. 6). The angle is also less than ninety degrees from the z-axis. Thus, there is a perpendicular to plane component of the magnetization. In the embodiment shown, the symmetry axis of the easy cone to be along z direction. However, in other embodiments, the symmetry axis of the easy cone may be in another direction, for example along the in-plane x or y directions.

The easy cone anisotropy may be understood as follows. For easy cone anisotropy, the magnetic anisotropy energy has a local maximum at or near the normal to the plane of the magnetic junction 300. In the embodiment shown, the local maximum is at or near zero degrees from the z-axis. In some embodiments, the local maximum is at least ten times $k_b T$, where $k_b$ is Boltzman's constant and T is the operating temperature of the magnetic junction. In other embodiments, the local maximum is at least twenty $k_bT$. In addition, the magnetic anisotropy energy 345 has a local minimum at some angle from the local maximum. The magnetization of the free layer 330 is stable along the local minimum. Thus, as can be seen by the magnetization M in FIG. 6 and the energy, the free layer magnetization is stable at some angle around the z-axis. These stable states form a cone around the normal to the plane of the layers of the magnetic junction 300. Hence, the free layer 330 magnetic anisotropy is termed "easy cone anisotropy".

The pinned layer 310 and/or the free layer 330 include half-metal(s). In some embodiments, the pinned layer 310 and/or the free layer 330 consists of a half-metals. In other embodiments, the multilayer in the pinned layer 310 and/or the free layer 330 includes half-metal layers. To that extent, the layers 310 and 330 are analogous to the layers 110 and 130, respectively. For example, the pinned layer 310 and/or the free layer 330 may have a layer at the interface with the spacer layer 320 that includes a half-metal. In other embodiments, the pinned layer 310 and/or the free layer 330 may be an alloy including one or more half-metals. Some half-metallic materials that might be used include one or more of the half-metallic materials described above.

The introduction of the easy cone anisotropy in the free layer 330 may improve the switching characteristics of the free layer 330. Because of the easy cone anisotropy, the free layer 330 magnetization may have a stable state canted from alignment with the normal to the layers of the magnetic junction 300 (e.g. canted from the z-axis). This initial nonzero angle allows the magnetization of the free layer 330 to be more easily switched by a spin transfer torque. This characteristic corresponds to a lower write error rate. The lower WER may be achieved even at low pulse widths (high data rates). In particular, the slope of the write error rate versus write current may remain sufficiently large even for pulse widths of less than ten ns. In some embodiments, an acceptable write error rate of $10^{-9}$ or less may be achieved for pulse widths of 10-30 ns or less. Thus, instead of assisting switching using a mechanism such as an external field, the easy cone anisotropy treats the physical cause of the high error rates. Consequently, the free layer 330 may have an improved write error rate even for lower pulse widths.

Other properties of the magnetic junction 300 may also be enhanced. The thermal stability and symmetry of the magnetic junction 300 may not be adversely affected. The magnitude of the local maximum in the magnetic anisotropy energy at zero degrees from the z-axis may be twenty times $k_bT$ or more. The global maximum at ninety degrees away from z axis is at least sixty times $k_bT$. In some embodiments this global maximum will be at least eighty times $k_bT$ or more. A global maximum of this magnitude may be sufficient to ensure thermal stability of the magnetic junction 300. Further, because an external magnetic field may not be required to switch the magnetic junction 300, the magnetic junction 300 may be better scalable to higher memory densities. Performance and flexibility of the magnetic junction 300 and a memory using the magnetic junction 300 may thus be improved.

Performance may be further enhanced by the use of half-metals. In particular, the switching current may be further reduced by the presence of half-metals in the pinned layer 310 and/or the free layer 330. Thus, performance of the junction 300 may be further enhanced.

Figure 7:
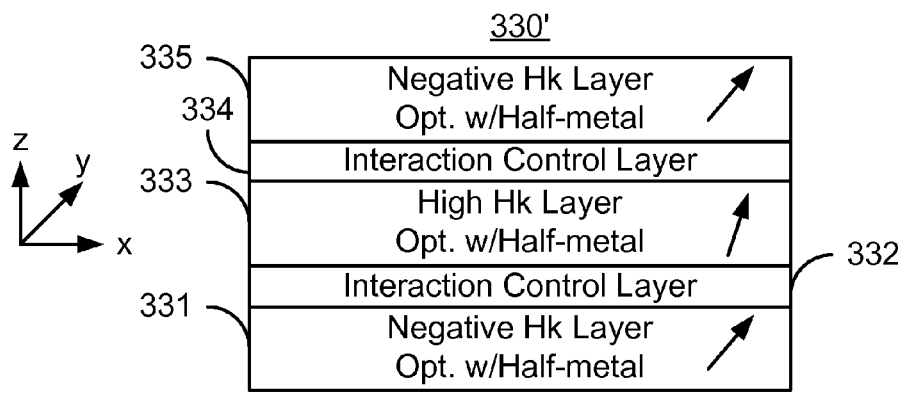
FIG. 7 depicts a portion of another exemplary embodiment of a magnetic junction.

The easy cone anisotropy may be obtained in the free layer 330 in a variety of manners. FIG. 7 depicts an exemplary embodiment of another free layer 330' that might be usable in the magnetic junction 300. For clarity, FIG. 7 is not to scale. The free layer 330' is analogous to the free layer 330 and thus includes similar structures. The free layer 330' includes negative perpendicular anisotropy layer 331 and optional perpendicular anisotropy layer 335, high perpendicular anisotropy layer 333, and interaction control layer 332 and optional interaction control layer 334. In other embodiments, the free layer 330' may have another number of layers. Ferromagnetic layers are alternated with nonmagnetic, interaction control layers. Further negative anisotropy layers are alternated with high anisotropy layers. For example, if the layer 330' were to include only three layers, then layers 331, 332, and 333 would be included. If the layer 330' included two additional layers, then an interaction control layer would separate the negative perpendicular anisotropy layer 335 and a high perpendicular anisotropy layer (not shown).

In the embodiment shown, two magnetic layers 331 and 335 have a negative perpendicular anisotropy, $H_k$. Thus, by itself, the magnetization of these layers would stay in the plane of the film. In some embodiments, the layers 331 and 335 may include the effect of partial perpendicular anisotropy. Stated differently, the perpendicular anisotropy of layers 331 and 335 is high, but not sufficient to overcome the out-of-plane demagnetization energy. The partial perpendicular anisotropy reduces the field required to saturate the magnetization of this layer along the z direction. In some embodiments, the partial perpendicular anisotropy field is at least twenty percent of $4\pi M_s$ and less than ninety percent of $4\pi M_s$. The other magnetic layer 333 has a high perpendicular anisotropy $H_k$. In some embodiments, the magnitude of the high perpendicular anisotropy depends upon the size of the magnetic junction. For example, for a larger magnetic junction 300, having a diameter on the order of one hundred nanometers in diameter, the large $H_k$ may be greater than one thousand Oersted (1 kOe). In contrast, for a smaller magnetic junction 300 having a diameter on the order of ten nanometers, $H_k$ is approximately five thousand Oersted (5 kOe) or greater depending on the thickness and saturation magnetization of the free layer. The layers 331, 333 and 335 are ferromagnetic and thus include one or more of Fe, Co, and Ni. Other materials including but not limited to B, Ta, Cs, Zr, Pt, Pd, Tb, and/or Ru may also be included in the layers 331, 333, and 335. Further, one or more of the layers 331, 333, 335 may include the half-metal described above. Note that the same or different materials may be used for the layers 331, 333, and 335. The combination of the material(s) used and/or the thicknesses of the layers 331, 333, and 335, as well as the exchange interaction control layers 332 and 334, may be tailored such that the desired anisotropies are produced in the layers 331, 333, and 335. In the free layer 330', the high perpendicular anisotropy layer 333 is sandwiched between two negative anisotropy layers 331 and 335. The resulting free layer 330' may have an easy cone anisotropy. Thus, when used in a magnetic junction, the free layer 330' may have an improved write error rate without sacrificing thermal stability, scalability, or low critical switching current. Further, the critical switching current may be further reduced through the use of half-metals in one or more of the layers 331, 333, and 335.

Figure 8:
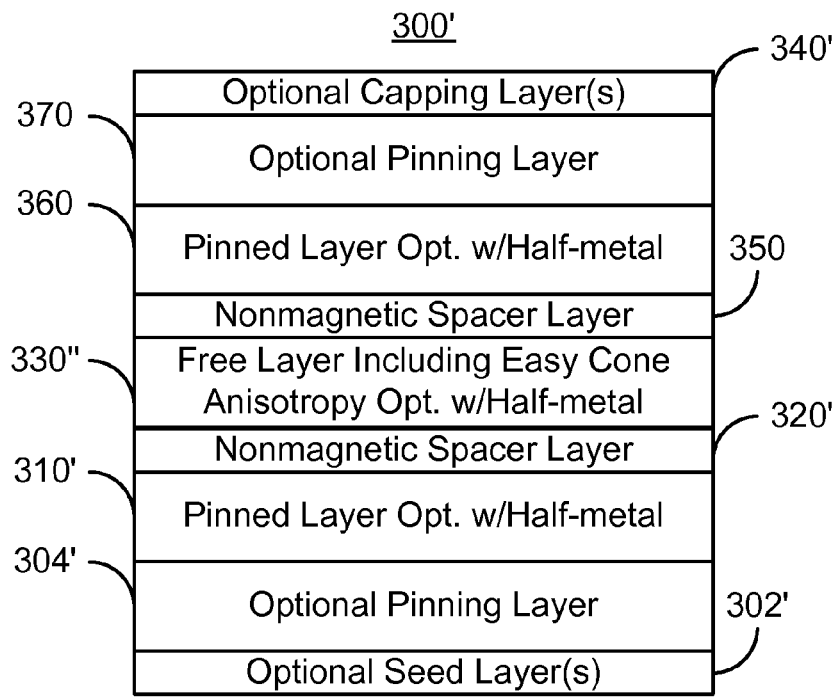
FIG. 8 depicts another exemplary embodiment of a magnetic junction.

FIG. 8 depicts an exemplary embodiment of another magnetic junction 300' including a free layer having an easy cone anisotropy. For clarity, FIG. 8 is not to scale. The magnetic junction 300' may be used in magnetic memory such as an STT-RAM. The magnetic junction 300' is analogous to the magnetic junctions 300 and thus includes similar structures. The magnetic junction 300' includes optional seed layer(s) 302', an optional pinning layer 304', a pinned layer 310', a nonmagnetic spacer layer 320', a free layer 330'' and optional capping layer(s) 340' that are analogous to the optional seed layer(s) 302, optional pinning layer 304, the pinned layer 310, the nonmagnetic spacer layer 320, the free layer 330, and optional capping layer(s) 340, respectively. In addition, the magnetic junction 300' includes an additional nonmagnetic spacer layer 350, an additional pinned layer 360, and an additional optional pinning layer 370. Thus, the magnetic junction 300' is a dual junction. The additional nonmagnetic spacer layer 350, additional pinned layer 360, and additional optional pinning layer 370 are analogous to the nonmagnetic spacer layer 320/320', the pinned layer 310/310', and the optional pinning layer 304/304'. The pinned layer 360 may also include one or more half-metal(s). Thus, the magnetic junction 300' may share the benefits of the junction 300. Further, because the magnetic junction 300' may be a dual junction, such as a dual tunneling junction, the switching current for the magnetic junction 300' may be reduced and the switching characteristics improved.

Figure 9:
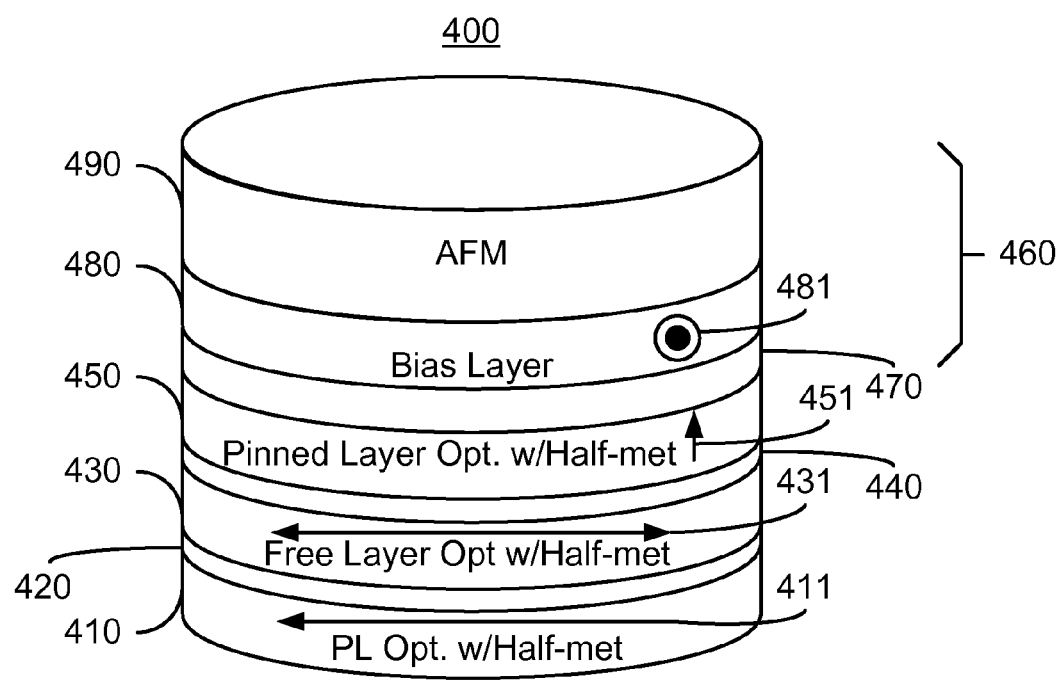
FIG. 9 depicts another exemplary embodiment of a magnetic junction.

FIG. 9 depicts an exemplary embodiment of a magnetic junction 400 usable in a magnetic memory or other device. For example, the magnetic junction 400 may be a magnetic tunneling junction (MTJ), spin valve, or ballistic magnetoresistance structure, or some combination thereof. The magnetic junction 400 is used may be used in a variety of applications. For example, the magnetic junction may be used in a magnetic memory such as an STT-RAM. For clarity, FIG. 9 is not to scale. The magnetic junction 400 includes a first pinned layer 410, a first nonmagnetic spacer layer 420, a free layer 430, a second nonmagnetic spacer layer 440, a second pinned layer 450, and a bias structure 460. The bias structure 460 includes a magnetic bias layer 480, a nonmagnetic layer 470 and an optional AFM layer 490 that may be used to fix the magnetization of the bias layer 480 in the desired direction. The nonmagnetic layer 470 is configured to reduce or break the magnetic exchange coupling between the pinned layer 450 and the magnetic bias layer 480. In some embodiments, the nonmagnetic layer may include Ta, Ru, and/or MgO. In other embodiments, other materials might be used. In an alternate embodiment, the exchange coupling between the layers 450 and 480 may be broken in another manner. Although layers 410, 420, 430, 440, 450, 470, and 480 are shown with a particular orientation, this orientation may vary in other embodiments. For example, the pinned layer 410 may be at the top (furthest from a substrate that is not shown) of the magnetic junction 400.

The pinned layers 410 and 450, as well as free layer 430 are ferromagnetic. Thus, layers 410, 430, and 450 may include one or more of Ni, Fe, and Co, particularly in an alloy form. In some embodiments, the layers 410, 430, and/or 450 include CoFe. In some such embodiments, the layer(s) 410, 430, and 450 consist of CoFeB. One or more of the layers 410, 430, and 450 include half-metal(s) as described above. In some embodiments, the layer(s) 410, 430, and/or 450 consists of half-metal(s). In other embodiments, the multilayer in the layer(s) 410, 430, and/or 450 includes half-metal layers. To that extent, the layers 410, 430, and/or 450 are analogous to the layers 110 and 130. For example, the layer(s) 410, 430, and/or 450 may have a layer at the interface with the spacer layer(s) 420 and/or 440 that includes a half-metal. In other embodiments, the layer(s) 410, 430, and/or 450 may be an alloy including one or more half-metals. Some half-metallic materials that might be used include one or more of the half-metallic materials that are described above.

The layers 410, 430, and 450 are configured to be stable at room temperature. For example, the magnetic anisotropy energy for the layers 410, 430, and/or 450 may be at least sixty times $k_bT$. In some embodiments, the magnetic anisotropy energies for the layers 410, 430, and/or 450 are at least eighty times $k_bT$ at room temperature (approximately thirty degrees centigrade). Although the layers 410, 430, and/or 450 are depicted as simple layers, in other embodiments, one or more of the layers 410, 430, and/or 450 may be a multilayer. For example, the pinned layer 410 and/or the free layer 430 may be a SAF including magnetic layers antiferromagnetically or ferromagnetically coupled through thin layers, such as Ru. In such a SAF, multiple magnetic layers interleaved with thin layer(s) of Ru or other material may be used. The layer(s) 410, 430, and/or 450 may also be another multilayer.

The pinned layer 410 and free layer 430 are magnetic and in-plane. The pinned layer 410 has magnetization 411. The changeable magnetization of the free layer 430 is shown by easy axis 431. The reference number 431 is thus used to indicate both the easy axis and the magnetization of the free layer 430. The magnetizations 411 and 431 of the layers 410 and 430, respectively, are substantially in-plane. Thus, the out-of-plane demagnetization energy of the layers 410 and 430 exceeds the out-of-plane anisotropy. The out-of-plane demagnetization field approaches $4\pi M_s$ for large cells, but is generally less than $4\pi M_s$ for smaller cells due to decreased demagnetization field at the edges.

Although the magnetization 431 of the free layer 430 is in-plane, in some embodiments, the free layer 430 has a high perpendicular anisotropy. Stated differently, the free layer 430 may be weakly in-plane. For example, in some such embodiments, the perpendicular anisotropy energy of the free layer 430 may be close to, but less than, the out-of-plane demagnetization energy. For example, the perpendicular anisotropy energy may be at least forty percent of the out-of-plane demagnetization energy. In some such embodiments, the perpendicular anisotropy energy may be at least eighty percent of the out-of-plane demagnetization energy. Also in some embodiments, the perpendicular anisotropy energy is not more than ninety percent of the demagnetization energy. The high perpendicular anisotropy may be achieved in a variety of ways including but not limited to use of a desired capping layer, such as MgO in addition to or as the nonmagnetic spacer layer 420 and/or 440. The free layer 430 may also have a high damping, for example due to doping or through the use of a multilayer. The free layer 430 may also use half-metallic ferromagnetic materials or other materials that improve spin transfer, magnetoresistance, and/or other desired properties. Finally, the magnetic junction 400 is configured such that the free layer magnetization 431 is switchable using a current driven through the magnetic junction. Thus, the magnetic junction 400 utilizes spin transfer torque. In some embodiments, other phenomena may be used in addition to or in lieu of spin transfer torque to switch the magnetic junction.

The nonmagnetic spacer layers 420 and 440 may be conductive, tunneling barrier layers, insulating layers having conductive channels, or other nonmagnetic layers for which the magnetic junction 400 has a magnetoresistance. In some embodiments, the spacer layers 420 and/or 440 are MgO. In some such embodiments, the nonmagnetic spacer layer(s) 420 and/or 440 are crystalline MgO, which may enhance the tunneling magnetoresistance (TMR) of the magnetic junction 400. In other embodiments, the spacer layer 420 and/or 440 may be a conductor, such as Cu. In alternate embodiments, the nonmagnetic spacer layer 420 and/or 440 might have another structure, for example a granular layer including conductive channels in an insulating matrix.

The bias structure 460 provides a magnetic bias at the free layer 430 that is substantially perpendicular to the easy axis 431 and in-plane at the free layer 430. In the embodiment shown, the magnetic bias is provided by the bias layer 480. Thus, the bias layer 480 has a magnetization 481 that is perpendicular to the easy axis 431 of the free layer 430 and that is in plane. Stated differently, the bias layer magnetization 481 is along the hard axis of the free layer 430. In some embodiments, the magnetic bias has a magnetic energy of at least twenty percent and not more than sixty percent of the anisotropy energy of the free layer 430.

In operation, a write current is driven through the magnetic junction 400. The spin transfer torque generated may cause the magnetization of the free layer 430 to cant farther away from the easy axis 431. The demagnetization field for the free layer is thus nonzero. The free layer 430 magnetization then precesses around the demagnetization field. The write current may then be removed. The static bias field generated by the bias structure 460 and, more specifically, the bias layer 480 still acts upon the free layer 430. This bias field oriented along the hard axis aids in bringing the magnetization of the free layer 430 back in-plane. Because of the presence of the field (not shown) from the bias layer 480, the precessing magnetization of the free layer 430 will return to being in-plane. More specifically, when the write current is removed from the magnetic junction 400, the magnetization of the free layer 430 then tends to return to an in plane position. This occurs because of the bias field generated by the bias layer 480. If the bias field from the bias structure 460 is sufficiently strong, the free layer 430 switches reproducibly to the desired state. In such embodiments, the bias field is at least twenty percent of the free layer 430. In other embodiments, the magnetic junction 400 may not reproducibly switch unless the write current is removed at a particular time. However, application of the static bias field still increases the margin in time for the current removal. Thus, reliable switching may be achieved with relaxed tolerances on the timing of the write current.

To read the data stored by the magnetic junction 400, a read current may be driven through the magnetic junction 400. Based on the relative orientations of the magnetizations 411 and 431 of the pinned layer 410 and the free layer 430, respectively, a magnetoresistance is provided!

The magnetic junction 400 may have improved characteristics. The magnetic junction 400 employs precessional switching. Thus, magnetic junction 400 may have improved (faster) switching times. In some embodiments, the switching times are on the order of fifty to one hundred picoseconds. As discussed above, the presence of the bias field due to the bias structure 460 may make precessional switching of the free layer 430 using spin transfer torque more reliable. More specifically, the magnetization of the free layer 430 may be more reliably brought back in plane and/or the margins for timing of removal of the write current may be increased. Further, the bias field is a static field from the magnetic bias layer 480. Thus, the magnetic bias scales with reductions in size of the cross-section of the device. Scalability of the magnetic junction 400 to smaller sizes may thus be improved. Performance of the magnetic junction 400 may be further enhanced. For example, an increase in the damping of the free layer 430 does not change the critical switching current, but does make it easier to trap the magnetization of the free layer 430 in its final state. Thus, switching may be more reliable. The perpendicular anisotropy of the free layer 430 may also be increased (though remaining below the out-of-plane demagnetization energy). In such embodiments, reliability of the switching may also be enhanced for example by increasing margins for timing of removal of the write current. Use of half-metal(s) in the layers 410, 430, and/or 450 may also reduce the critical/switching current. Thus, performance of the magnetic junction 400 may be improved.

Figure 10A:
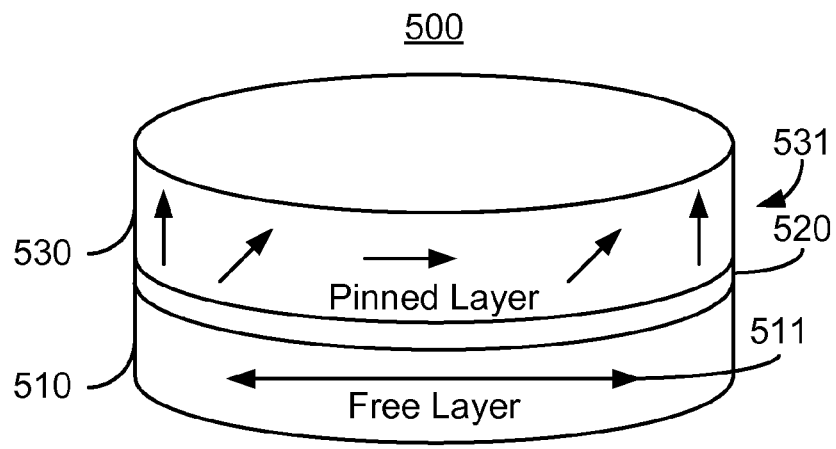
FIGS. 10A and 10B depict another exemplary embodiment of a magnetic junction.
Figure 10B:
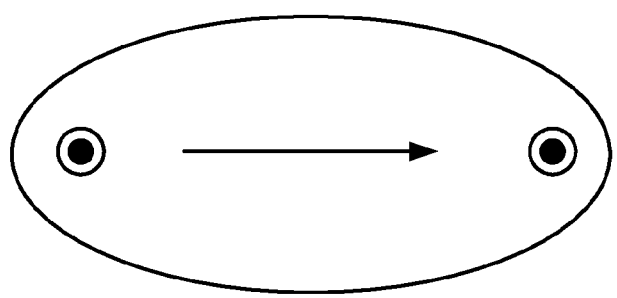

FIGS. 10A-10B depict perspective and top views of an exemplary embodiment of a magnetic junction 500 utilizing precessional switching. For clarity, FIGS. 10A-10B are not to scale. The magnetic junction 500 includes a free layer 510, a nonmagnetic spacer layer 520, and a pinned layer 530. Although layers 510, 520, and 530 are shown with a particular orientation, this orientation may vary in other embodiments. For example, the free layer 510 may be closer to the top (furthest from a substrate that is not shown) of the magnetic junction 500. Although depicted as a simple layer, the free layer 510 may include multiple layers. For example, the pinned layer 510 may be a SAF including magnetic layers antiferromagnetically or ferromagnetically coupled through thin layers, such as Ru. In such a SAF, multiple magnetic layers interleaved with thin layer(s) of Ru or other material may be used. The free layer 510 may also be another multilayer.

The free layer 510 has a magnetization shown by easy axis 511. The free layer 510 is analogous to the free layer 430. For example, the free layer 510 may be a SAF, have a high perpendicular anisotropy, and/or a higher damping. The spacer layer 520 is nonmagnetic. In some embodiments, the spacer layer 520 is an insulator, for example a tunneling barrier. In such embodiments, the spacer layer 520 may include crystalline MgO, which may enhance the TMR of the magnetic junction. In other embodiments, the spacer layer may be a conductor, such as Cu. In alternate embodiments, the spacer layer 520 might have another structure, for example a granular layer including conductive channels in an insulating matrix.

The pinned layer 530 has a magnetization 531 that varies across the pinned layer 530. In some regions, the magnetization 511 is in plane, while in others the magnetization is perpendicular to plane. In the embodiment shown, the center of the pinned layer 530 has an in-plane magnetization while the edges of the pinned layer 530 are perpendicular to plane. This may be achieved, for example, by having a high perpendicular anisotropy. In some embodiments, the perpendicular anisotropy is at least 85% but less than 100% of the demagnetization energy.

The layers 510 and/or 530 include half-metals. In some embodiments, the layer(s) 510 and/or 530 consists of half-metal(s). In other embodiments, the multilayer in the layer(s) 510 and/or 530 includes half-metal layers. To that extent, the layers 510 and/or 530 are analogous to the layers 110 and 130. For example, the layer(s) 510 and/or 530 may have a layer at the interface with the spacer layer 520 that includes a half-metal. In other embodiments, the layer(s) 510 and/or 530 may be an alloy including one or more half-metals. Some half-metallic materials that might be used include one or more of the half-metallic materials described above.

Because the magnetization of the pinned layer 530 varies across the pinned layer 530, the pinned layer 530 may function as a combination of the pinned layers 410 and 450 of FIG. 9. In particular, the edges having the out-of-plane magnetization may enhance precessional switching in a manner analogous to the pinned layer 450 of the magnetic junction 400. The central portion of the pinned layer 530 may be considered to be the portion of the pinned layer 530 used for reading. In other words, the orientation of the magnetization of the free layer 510 versus that of the central portion of the pinned layer 530 gives rise to the magnetoresistance of the magnetic junction 500.

Because the magnetic junction 500 may use precessional switching, higher speed switching may be accomplished.

Further, as fewer layers may be used, processing may be simplified. Use of half-metals may also provide a reduced switching current.

Figure 11:
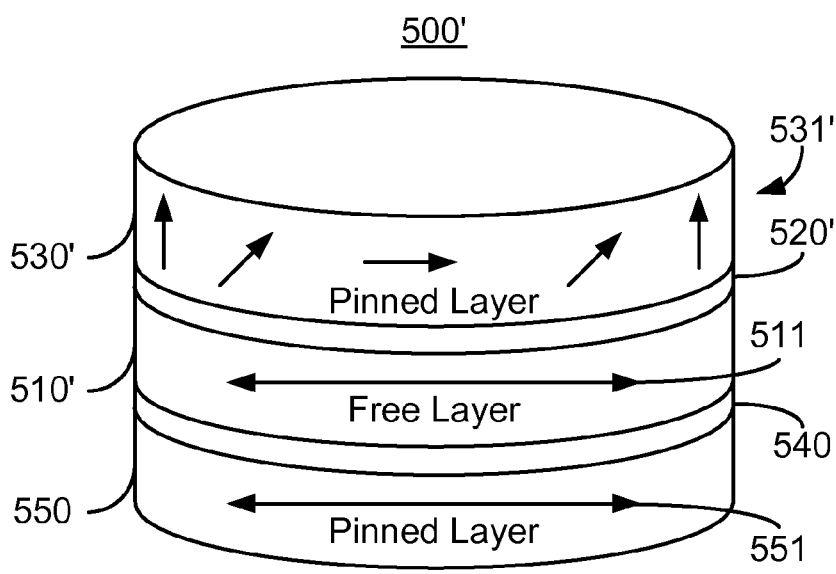
FIG. 11 depicts another exemplary embodiment of a magnetic junction.

FIG. 11 depicts an exemplary embodiment of a magnetic junction 500'. For clarity, FIG. 11 is not to scale. The magnetic junction 500' is analogous to the magnetic junction 500. Consequently, analogous components are labeled similarly. The magnetic substructure 500' thus includes a free layer 510', a first nonmagnetic spacer layer 520', and a pinned layer 530' analogous to the free layer 510, the nonmagnetic spacer layer 520, and the pinned layer 530, respectively. The pinned layer 550 may also include half-metal(s) as described above. In addition, the magnetic junction 500' also includes an additional nonmagnetic spacer layer 540 and an additional pinned layer 550. Thus, the magnetic junction 500 is a dual magnetic junction. The magnetic junction 500' shares the benefits of the magnetic junction 500. For example, precessional switching may be achieved.

Figure 12:
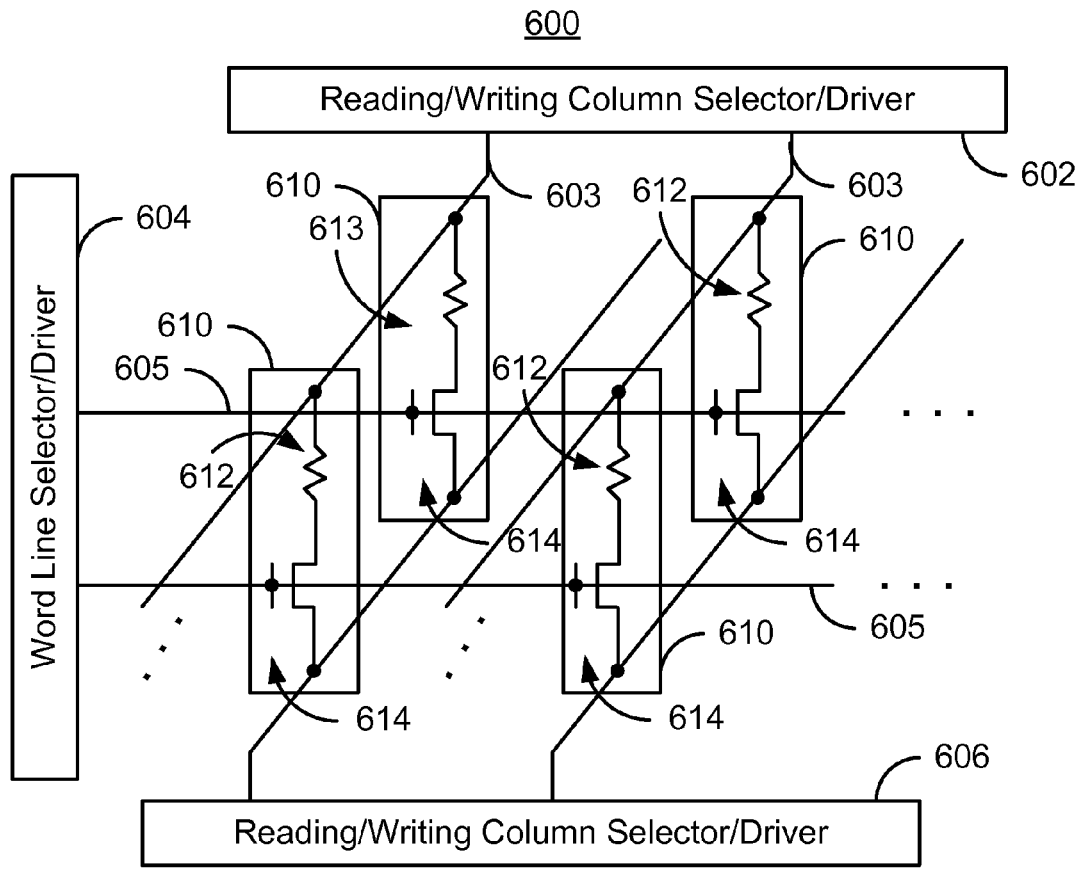
FIG. 12 depicts an exemplary embodiment of a memory utilizing magnetic junctions in the memory element(s) of the storage cell(s).

The magnetic junctions 100, 100', 200, 200', 300, 300', 400, 500, and/or 500' may be used in a magnetic memory. FIG. 12 depicts an exemplary embodiment of one such memory 600. The magnetic memory 600 includes reading/writing column select drivers 602 and 606 as well as word line select driver 604. Note that other and/or different components may be provided. The storage region of the memory 600 includes magnetic storage cells 610. Each magnetic storage cell includes at least one magnetic junction 612 and at least one selection device 614. In some embodiments, the selection device 614 is a transistor. The magnetic junctions 612 may be one of the magnetic junctions 100, 100', 200, 200', 300, 300', 400, 500, and/or 500'. Although one magnetic junction 612 and one selection devices 614 are shown per cell 610, in other embodiments, another number of magnetic junctions 612 and/or 614 may be provided per cell. As such, the magnetic memory 600 may enjoy the benefits described above, such as faster and more reliable switching and a lower critical switching current.

Figure 13:
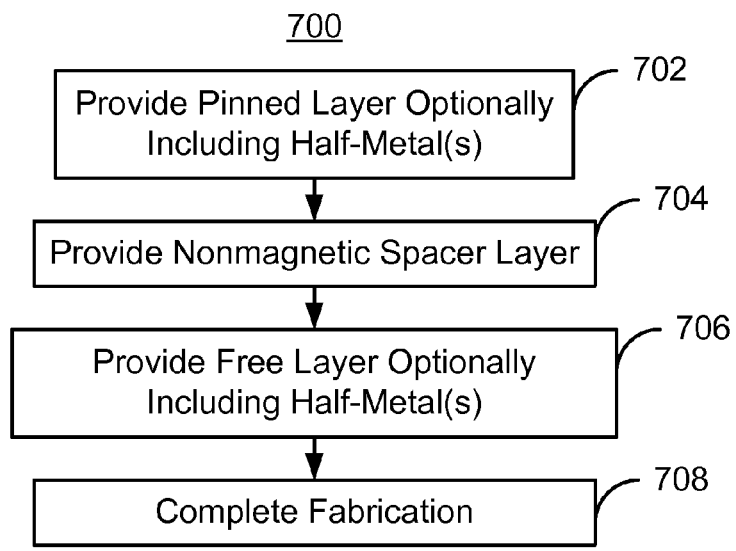
FIG. 13 is a flow chart depicting an exemplary embodiment of a method for providing a magnetic junction.

FIG. 13 depicts an exemplary embodiment of a method 700 for fabricating magnetic substructure. For simplicity, some steps may be omitted or combined. The method 700 is described in the context of the magnetic junction 100. However, the method 500 may be used on other magnetic junctions such as the junctions 100', 100', 200, 300, 300', 400, 500, and/or 500' and/or free layer 330'. Further, the method 700 may be incorporated into fabrication of magnetic memories, such as the magnetic memory 600. Thus the method 700 may be used in manufacturing a STT-RAM or other magnetic memory. The method 700 may commence after the seed layer(s) (not shown) and optional pinning layer 102 are provided.

The pinned layer 110 is provided, via step 702. Step 702 may include depositing the desired materials at the desired thickness of the pinned layer 110. Further, step 702 may include providing a SAF. In some embodiments, the step of providing pinned layer 110 includes depositing half-metal(s). The nonmagnetic layer 120 is provided, via step 704. Step 704 may include depositing the desired nonmagnetic materials, including but not limited crystalline MgO. In addition, the desired thickness of material may be deposited in step 702.

The free layer 130 is provided, via step 706. In some embodiments, step 706 may be completed by depositing a multilayer, SAF, and/or other structure. In some embodiments, the step of providing free layer 130 includes depositing half-metal(s). Fabrication is then completed, via step 708. For example, an additional spacer layer 140, an additional pinned layer 150 and/or optional additional pinning layer 460 may be provided. In some embodiments, in which the layers of the magnetic junction are deposited as a stack, then defined, step 708 may include defining the magnetic junction 100, performing anneals, or otherwise completing fabrication of the magnetic junction 100. Further, if the magnetic junction 100 is incorporated into a memory, such as the STT-RAM 400, step 508 may include providing contacts, bias structures, and other portions of the memory 400.

Thus, the magnetic junction 100, 100', 200, 200', 300 and/or 300' is formed. Consequently, the benefits of the magnetic junction may be achieved.

A magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a pinned layer having a pinned layer magnetization;
   a nonmagnetic spacer layer; and
   a free layer having an easy axis, the nonmagnetic spacer layer residing between the pinned layer and the free layer, at least one of the free layer and the pinned layer including at least one half-metal;
   wherein the magnetic junction is configured such that the free layer is switchable between a plurality of stable magnetic states when a write current is passed through the magnetic junction;
   wherein the free layer has a magnetic anisotropy selected from an easy cone anisotropy and a magnetic bias induced anisotropy, the easy cone anisotropy being such that at least one of the plurality of stable magnetic states occurs for a free layer magnetic moment being at a nonzero angle around the easy axis, the magnetic bias induced anisotropy being generated by a magnetic bias from a magnetic bias structure in the magnetic junction, the magnetic bias being substantially perpendicular to the easy axis of the free layer and to a pinned layer easy axis for the pinned layer, and wherein the pinned layer easy axis is substantially perpendicular to the easy axis of the free layer if the free layer has the magnetic bias induced anisotropy.

2. The magnetic junction of claim 1 wherein the free layer easy axis is perpendicular-to-plane.

3. The magnetic junction of claim 1 wherein the free layer easy axis is in-plane.

4. The magnetic junction of claim 1 wherein the at least one half-metal includes at least one of $CrO_2$, $Sr_2FeMoO_6$, $(La0.7Sr0.3)MnO_3$, $Fe_3O_4$, NiMnSb.

5. The magnetic junction of claim 1 wherein the at least one half-metal includes T=XYZ, where X is selected from Mn, Fe, Co, Ni, Cu, Zn, Ru, Rh, Pd, Ag, Cd, Ir, Pt, and Au, Y is selected from Ti, V, Cr, Mn, Fe, Y, Zr, Nb, Hf, Ta, Gd, Tb, Dy, Ho, Er, Tm, Yb, and Lu, and Z is selected from Al, Si, Ga, Ge, As, In, Sn, Sb, Pb, and Bi.

6. The magnetic junction of claim 1 wherein the at least one half-metal includes TM where T=XYZ, where X is selected from Mn, Fe, Co, Ni, Cu, Zn, Ru, Rh, Pd, Ag, Cd, Ir, Pt, and Au, Y is selected from Ti, V, Cr, Mn, Fe, Y, Zr, Nb, Hf, Ta, Gd, Tb, Dy, Ho, Er, Tm, Yb, and Lu, Z is selected from Al, Si, Ga, Ge, As, In, Sn, Sb, Pb, and Bi, and M is selected from Mn, Fe, Co, Ni, Cu, Zn, Ru, Rh, Pd, Ag, Cd, Ir, Pt, Au, Ti, V, Cr, Mn, Fe, Y, Zr, Nb, Hf, Ta, Gd, Tb, Dy, Ho, Er, Tm, Yb, Lu, Al, Si, Ga, Ge, As, In, Sn, Sb, Pb, or Bi.

7. The magnetic junction of claim 1 wherein the at least one half-metal includes $RE_{1-x}M_xMnO_3$, where x is less than or equal to 1, M is Ca, Sr, Ba, or Pb, RE is selected from a rare earth metal and an alkaline-earth metal.

8. The magnetic junction of claim 7 wherein the rare earth metal is selected from La, Ce, Pr, Nd, Pm, Sm, Eu, Gd, Tb, Dy, Ho, Er, Tm, Yb, and Lu.

9. The magnetic junction of claim 7 wherein the alkaline-earth metal is selected from Be, Mg, Ca, Sr, Ba, and Ra.

10. The magnetic junction of claim 1 wherein the at least one half-metal includes at least one double perovskite $A_2MM'O_6$ where A is selected from a rare earth and alkaline-earth metal described and M and M' are two different elements selected from Sc, Ti, V, Mn, Fe, Co, Ni, Cu, Zn, Y, Zr, Nb, Mo, Tc, Ru, Rh, Pd, Ag, Hf, Ta, W, Re, Pt, Au, and Hg.

11. The magnetic junction of claim 10 wherein the rare earth metal is selected from La, Ce, Pr, Nd, Pm, Sm, Eu, Gd, Tb, Dy, Ho, Er, Tm, Yb, and Lu.

12. The magnetic junction of claim 10 wherein the alkaline-earth metal is selected from Be, Mg, Ca, Sr, Ba, and Ra.

13. The magnetic junction of claim 1 wherein the at least one half-metal includes at least one of $CrO_2$ and $Fe_3O_4$.

14. A magnetic junction for use in a magnetic device comprising:
a pinned layer having a pinned layer magnetization;
a nonmagnetic spacer layer; and
a free layer having an easy axis and an easy cone magnetic anisotropy, the nonmagnetic spacer layer residing between the pinned layer and the free layer, at least one of the free layer and the pinned layer including at least one half-metal;
wherein the magnetic junction is configured such that the free layer is switchable between a plurality of stable magnetic states when a write current is passed through the magnetic junction
wherein the free layer further includes wherein the free layer includes a high perpendicular anisotropy layer, a negative perpendicular anisotropy layer, and an interaction control layer between the high perpendicular anisotropy layer and the negative perpendicular anisotropy layer, the high perpendicular anisotropy layer and the negative perpendicular anisotropy layer providing the cone anisotropy.

15. A magnetic junction for use in a magnetic device comprising:
a pinned layer having a pinned layer magnetization;
a nonmagnetic spacer layer; and
a free layer having an easy axis, the nonmagnetic spacer layer residing between the pinned layer and the free layer, at least one of the free layer and the pinned layer including at least one half-metal;
wherein the magnetic junction is configured such that the free layer is switchable between a plurality of stable magnetic states when a write current is passed through the magnetic junction
wherein the pinned layer has a pinned layer magnetization, a center, a first edge, and a second edge, the nonmagnetic spacer layer residing between the free layer and the pinned layer, the pinned layer magnetization varying across the pinned layer such that the pinned layer is substantially perpendicular-to-plane at at least the first edge and the second edge and is substantially in plane at the center.

16. The magnetic junction of claim 15 wherein the pinned layer has an out-of-plane demagnetization energy and a perpendicular anisotropy that is at least eighty-five percent of the out-of-plane demagnetization energy.

17. The magnetic junction of claim 1 further comprising:
an additional nonmagnetic spacer layer, the free layer residing between the additional nonmagnetic spacer layer and the nonmagnetic spacer layer; and
an additional pinned layer, the additional nonmagnetic spacer layer residing between the free layer and the additional pinned layer.

18. The magnetic junction of claim 17 further including the bias structure providing the magnetic bias at the free layer, the bias structure having a magnetic portion substantially exchange decoupled from the additional pinned layer, the magnetic bias being substantially perpendicular to an additional pinned layer easy axis for the additional pinned layer;
wherein the magnetic junction is configured such that the free layer is switchable between a plurality of stable magnetic states when a write current is passed through the magnetic junction.

19. The magnetic junction of claim 18 wherein the bias structure includes a nonmagnetic layer adjoining the additional pinned layer and a bias layer having a bias layer magnetization, the bias layer magnetization being substantially perpendicular to the easy axis of the free layer and in-plane.

20. A magnetic junction for use in a magnetic device comprising:
a pinned layer having a pinned layer magnetization, a center, a first edge and a second edge;
a nonmagnetic spacer layer; and
a free layer having an easy axis, the nonmagnetic spacer layer residing between the pinned layer and the free layer, at least one of the free layer and the pinned layer including at least one half-metal;
wherein the magnetic junction is configured such that the free layer is switchable between a plurality of stable magnetic states when a write current is passed through the magnetic junction
wherein the pinned layer magnetization varies across the pinned layer such that the pinned layer is substantially perpendicular-to-plane at at least the first edge and the second edge and is substantially in plane at the center.

21. A magnetic memory comprising:
a plurality of magnetic storage cells, each of the plurality of magnetic storage cells including at least one magnetic junction, the at least one magnetic junction including a pinned layer having a pinned layer magnetization and a pinned layer easy axis, a nonmagnetic spacer layer, and a free layer having a free layer easy axis, the nonmagnetic spacer layer residing between the pinned layer and the free layer, at least one of the free layer and the pinned layer including at least one half-metal, the magnetic junction being configured such that the free layer is switchable between a plurality of stable magnetic states when a write current is passed through the magnetic junction, the pinned layer having a center, a first edge, and a second edge; and
a plurality of bit lines;
wherein at least one of the free layer has of an easy cone anisotropy such that at least one of the plurality of stable magnetic states occurs for a free layer magnetic moment being at a nonzero angle from the easy axis, the free layer has a magnetic bias that is substantially perpendicular both to the free layer easy axis and to the pinned layer easy axis, and the pinned layer magnetization varies across the pinned layer such that the pinned layer is substantially perpendicular-to-plane at at least the first edge and the second edge and is substantially in plane at the center, the magnetic bias being from a bias structure.

22. A method for providing a magnetic junction for use in a magnetic device comprising:

providing a pinned layer having a pinned layer magnetization, a center, a first edge, a second edge and a pinned layer easy axis;

providing a nonmagnetic spacer layer; and providing a free layer having free layer easy axis, the nonmagnetic spacer layer residing between the pinned layer and the free layer, at least one of the free layer and the pinned layer including at least one half-metal;

wherein the magnetic junction is configured such that the free layer is switchable between a plurality of stable magnetic states when a write current is passed through the magnetic junction; and wherein at least one of the free layer has of an easy cone anisotropy such that at least one of the plurality of stable magnetic states occurs for a free layer magnetic moment being at a nonzero angle from the easy axis, the free layer has a magnetic bias that is substantially perpendicular both to the free layer easy axis and to the pinned layer easy axis, and the pinned layer magnetization varies across the pinned layer such that the pinned layer is substantially perpendicular-to-plane at at least the first edge and the second edge and is substantially in plane at the center, the magnetic bias being from a bias structure.

* * * * *